United States Patent [19]
Tanigami et al.

[11] Patent Number: 5,596,592
[45] Date of Patent: Jan. 21, 1997

[54] SEMICONDUCTOR LASER DEVICE

[75] Inventors: Yoriko Tanigami; Tomoko Kadowaki; Akira Takemoto, all of Itami, Japan

[73] Assignee: Mitsubish Denki Kabushiki Kaisha, Tokyo, Japan

[21] Appl. No.: 515,000

[22] Filed: Aug. 14, 1995

[30] Foreign Application Priority Data

Aug. 23, 1994 [JP] Japan .................... 6-198346

[51] Int. Cl.$^6$ ..................... H01S 3/19
[52] U.S. Cl. ............................. 372/46
[58] Field of Search ................ 372/46, 45, 44

[56] References Cited

U.S. PATENT DOCUMENTS

| | | | |
|---|---|---|---|
| 4,637,845 | 1/1987 | Hirano | 148/171 |
| 5,383,213 | 1/1995 | Irikawa et al. | 372/46 |
| 5,390,205 | 2/1995 | Mori et al. | 372/46 |
| 5,426,658 | 6/1995 | Kaneno et al. | 372/46 |
| 5,452,315 | 9/1995 | Kimura et al. | 372/46 |

FOREIGN PATENT DOCUMENTS

| | | |
|---|---|---|
| 59-117288 | 7/1984 | Japan . |
| 62-159488 | 7/1987 | Japan . |
| 1300581 | 12/1989 | Japan . |

*Primary Examiner*—James W. Davie
*Attorney, Agent, or Firm*—Leydig, Voit & Mayer

[57] ABSTRACT

A semiconductor laser device includes a ridge waveguide having two side surfaces, a crystalline burying layer disposed at both side surfaces of the ridge waveguide, and a second conductivity type contact layer disposed on the burying layer and the ridge waveguide. The burying layer includes a first conductivity type first current blocking layer in contact with the side surfaces of the ridge waveguide, a second conductivity type second current blocking layer disposed on a portion of the first current blocking layer and separated from the ridge waveguide by a portion of the first current blocking layer near the ridge waveguide, a first conductivity type third current blocking layer disposed on a portion of the first current blocking layer near the ridge waveguide and on the second current blocking layer, and a second conductivity type final burying layer disposed on the third current blocking layer. In this structure, there is no pn junction at a regrowth interface between the final burying layer and the contact layer so that reduction in the forward voltage of the pn junction in continuous operation is avoided and increasing leakage current is suppressed so that the threshold current and light output of the laser do not deteriorate over time.

6 Claims, 11 Drawing Sheets

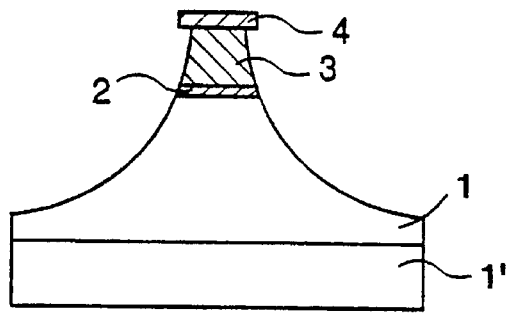
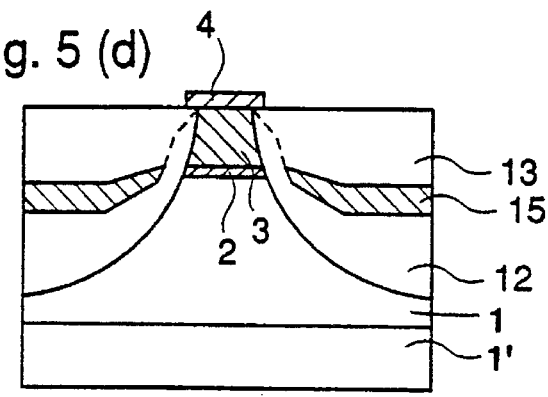
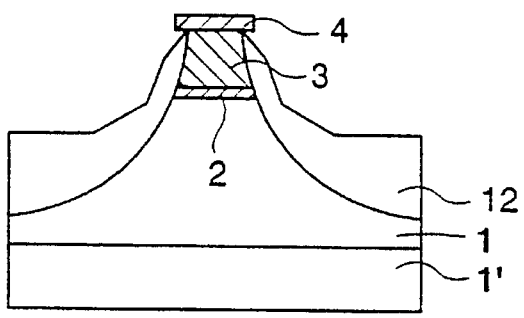
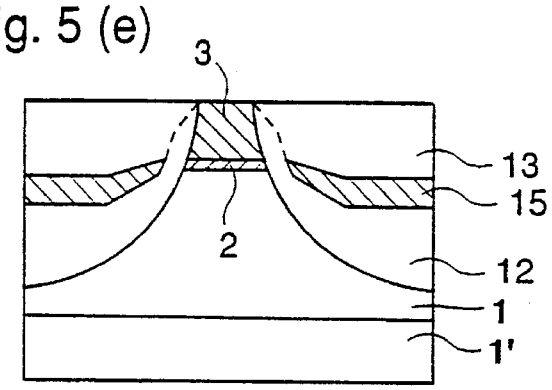
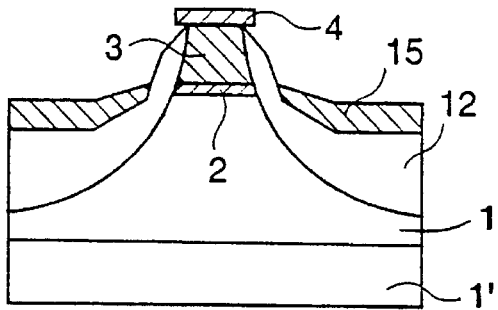

SEMICONDUCTOR LASER DEVICE

FIELD OF THE INVENTION

The present invention relates to a semiconductor laser device and a method of fabricating the semiconductor laser device.

BACKGROUND OF THE INVENTION

A conventional semiconductor laser device that includes a ridge waveguide, current blocking layers disposed on both sides of the ridge waveguide, and a contact layer, and a method of fabricating this semiconductor device are described below.

FIGS. 11(a)–11(e) are sectional views illustrating process steps in a method of fabricating the conventional semiconductor laser device. Initially, a p type InP first cladding layer 1, an InGaAsP active layer 2, and an n type InP second cladding layer 3 are successively epitaxially grown on a p type InP substrate. Then, an insulating film 4 comprising SiO is deposited on a center portion of the second cladding layer 3 and, using the insulating film as a mask, the first cladding layer 1, the active layer 2, and the second cladding layer 3 are selectively etched to form a ridge waveguide (figure 11(a)). In the step of FIG. 11(b), a p type InP first current blocking layer 12 having a high charge carrier concentration is selectively epitaxially grown on both sides of the ridge waveguide. Further, as shown in FIG. 11(c), an n type InP second current blocking layer 6 is selectively epitaxially grown on the p type InP first current blocking layer 12. In this growth step, the second current blocking layer 6 grows only on a specific crystalline plane of the first current blocking layer 12. Therefore, it is possible to form the n type InP second current blocking layer 6 so that it is not in contact with the side surface of the ridge waveguide. Then, a p type InP third current blocking layer 13 having a high charge carrier concentration is selectively epitaxially grown on the first and second current blocking layers to form a crystalline burying layer comprising the first, second, and third current blocking layers (FIG. 11(d)). In the step of FIG. 11(e), the insulating film 4 is removed. Finally, an n type InP contact layer 8 is epitaxially grown, followed by grinding at the rear surface of the substrate, and formation of an electrode 20a on the ground rear surface of the substrate and an electrode 20b on the n type InP contact layer 8, completing the semiconductor laser device shown in FIG. 12.

In this semiconductor laser device, when a forward bias voltage is applied across the electrodes 20a and 20b, a current flows through the ridge waveguide comprising the n type InP second cladding layer 3, the active layer 2, and the p type InP first cladding layer 1, and holes from the p type InP first cladding layer 1 and electrons from the n type InP second cladding layer 3 are injected into the active layer 2. Radiative recombination of the electrons with the holes produces light in the active layer 2, resulting in laser oscillation.

In the fabrication method described, since the layers of the ridge waveguide and the burying layer are continuously epitaxially grown, no surface of the grown layers is exposed to air during growth. However, the p type InP first current blocking layer 12 is regrown on a side surface of the ridge waveguide that is exposed to air during etching, and the n type InP contact layer 8 is regrown on the upper surfaces of the burying layer and the ridge waveguide that have been exposed to air during the etching of the insulating film 4. The surfaces where regrowth occurs are called regrowth interfaces.

It is known that when the p-n junction between the p type InP first current blocking layer 12 and the n type InP second cladding layer 3 and the p-n junction between the p type InP third current blocking layer 13 and the n type InP contact layer 8 are located at regrowth interfaces, leakage current not passing through the active layer increases. Thus, the forward voltage at which a forward current starts to flow is reduced and the forward current across the p-n junction under continuous operation increases, causing deterioration of laser characteristics, such as a rise in the threshold current and a reduction in light output. In order to avoid this problem, Zn is employed as the dopant impurity in the p type InP first and third current blocking layers 12 and 13. These p type current blocking layers have significantly higher charge carrier concentrations than the n type cladding layer 3 and the n type contact layer 8. The Zn diffuses from the p type current blocking layers 12 and 13 into the n type cladding layer 3 and the n type contact layer 8 during the epitaxial growth process or during heat treatment after the epitaxial growth process, reversing the conductivity type of a thin portion of the n type cladding layer 3 and the n type contact layer 8 in contact with regrowth interfaces. Therefore, the p-n junction between the p type InP third current blocking layer 13 and the n type InP contact layer 8 is not located at the regrowth interface 9a of the upper portion of the burying layer shown in FIG. 12, but at a position 14a in the n type contact layer 8. The p-n junction between the p type InP first current blocking layer 12 and the n type InP second cladding layer 3 is not located at the regrowth interface 9b of the side surface of the n type cladding layer 3, but at a position 14b in the n type cladding layer 3. Consequently, the forward voltage of the p-n junction under continuous operation is not reduced and does not cause deterioration of laser characteristics.

Although deterioration of the laser characteristics under continuous operation can be prevented by diffusing Zn from the p type current blocking layers 12 and 13 into the n type cladding layer 3 and the n type contact layer 8, Zn diffuses not only into the n type cladding layer 3 and the n type contact layer 8, but also into the n type InP second current blocking layer 6. Zn compensates the dopant impurities of the n type second current blocking layer 6, whereby the charge carrier concentration of the n type current blocking layer 6 is reduced and the current blocking effect due to the p-n-p transistor effect is reduced. That compensation causes an increase in leakage current and deterioration of laser characteristics.

SUMMARY OF THE INVENTION

It is an object of the present invention to provide a method of fabricating a semiconductor laser device in which deterioration of laser characteristics under continuous operation are prevented without reducing the current blocking effect of the current blocking layers, and a semiconductor laser device fabricated by the method.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, a method of fabricating a semiconductor laser device includes forming a ridge waveguide comprising a first cladding layer, an active layer, and a second cladding layer, successively growing by selective epitaxial growth a first current blocking layer comprising a first conductivity type semiconductor, a second current blocking layer separated from the ridge waveguide by a portion of the first current blocking layer in the vicinity of the ridge waveguide and comprising a second conductivity type semiconductor, a third current blocking layer comprising a first conductivity type semiconductor, and a final burying layer, comprising a second conductivity type semiconductor, on both sides of the ridge waveguide to form a crystalline burying layer, and epitaxially growing a contact layer comprising a second conductivity type semiconductor on the second cladding layer and on the final burying layer. Since a p-n junction is not formed at the regrowth interface between the final burying layer and the contact layer, a reduction in the forward voltage of the p-n junction under continuous operation is avoided and an increase in leakage current is suppressed, preventing deterioration of laser characteristics, such as a rise in a threshold current and a reduction in light output. Since there is no diffusion of dopant impurities from the third current blocking layer of the first conductivity type into the contact layer, no dopant impurities diffuse from the first and third current blocking layers into the second current blocking layer of the second conductivity type, and no deterioration of the current blocking effect of the current blocking layers due to a reduction of the charge carrier concentration of the second current blocking layer occurs.

According to a second aspect of the present invention, a method of fabricating a semiconductor laser device includes successively epitaxially growing a first cladding layer comprising a first conductivity type semiconductor, an active layer, and a second cladding layer comprising a second conductivity type semiconductor on a front surface of a semiconductor substrate of the first conductivity type, depositing an insulating film on a prescribed region of the second cladding layer, selectively etching the first cladding layer, the active layer, and the second cladding layer using the insulating film as a mask to form a ridge waveguide, successively growing by selective epitaxial growth a lower layer of a first current blocking layer comprising a first conductivity type semiconductor having a charge carrier concentration higher than that of the second conductivity type second cladding layer, an upper layer of a first current blocking layer comprising a first conductivity type semiconductor having a charge carrier concentration lower than that of the lower layer of the first current blocking layer, a second current blocking layer separated from the ridge waveguide by a portion of the first current blocking layer in the vicinity of the ridge waveguide and comprising a second conductivity type semiconductor, a lower layer of a third current blocking layer comprising a first conductivity type semiconductor, and an upper layer of a third current blocking layer, comprising a first conductivity type semiconductor having a carrier concentration higher than those of the lower layer of the third current blocking layer and the second conductivity type contact layer, on both sides of the ridge waveguide to form a crystalline burying layer, removing the insulating film, and epitaxially growing a contact layer comprising a second conductivity type semiconductor on the second cladding layer and on the third current blocking layer. Due to the heating while forming the crystalline burying layer by epitaxial growth and while epitaxially growing the contact layer or in a heat treatment after the epitaxial growth of the contact layer, dopant impurities diffuse from the first and third current blocking layers to the second cladding layer and the contact layer, respectively, whereby a thin portion of the second cladding layer in contact with the first current blocking layer and a thin portion of the contact layer in contact with the third current blocking layer are reversed to the first conductivity type. Therefore, a p-n junction between the contact layer and the third current blocking layer moves from the regrowth interface between these layers to a position in the contact layer, and a p-n junction between the second cladding layer and the first current blocking layer moves from the regrowth interface between these layers to a position in the second cladding layer. Consequently, in the semiconductor laser device fabricated by this method, a reduction in a forward voltage of the p-n junction under continuous operation is avoided, preventing deterioration of laser characteristics, such as a rise in threshold current and a reduction in light output. Meanwhile, since the upper layer of the first current blocking layer and the lower layer of the third current blocking layer in contact with the second current blocking layer have a lower charge carrier concentration, the dopant impurities diffused from the first and third current blocking layers into the second current blocking layer are few, whereby deterioration of the current blocking effect of the current blocking layers due to a reduction of the charge carrier concentration of the second current blocking layer is prevented.

According to a third aspect of the present invention, a fabricating method of a semiconductor laser device includes successively epitaxially growing a first cladding layer comprising a first conductivity type semiconductor, an active layer, and a second cladding layer comprising a second conductivity type semiconductor on a front surface of a semiconductor substrate of the first conductivity type, depositing an insulating film on a region of the second cladding layer, selectively etching the first cladding layer, the active layer, and the second cladding layer using the insulating film as a mask to form a ridge waveguide, successively growing by selective epitaxial growth a first current blocking layer comprising a first conductivity type semiconductor having a charge carrier concentration higher than that of the second cladding layer, a second current blocking layer separated from the ridge waveguide by a portion of the first current blocking layer in the vicinity of the ridge waveguide and comprising a second conductivity type semiconductor, and a third current blocking layer comprising a first conductivity type semiconductor having a charge carrier concentration higher than that of a second conductivity type contact layer on both sides of the ridge waveguide to form a crystalline burying layer, removing the insulating film, and epitaxially growing a contact layer comprising the second conductivity type semiconductor on the second cladding layer and on the third current blocking layer. In the crystalline burying layer forming process, the second current blocking layer is selectively epitaxially grown to include impurities that are electrically neutral and interstitial in the crystal lattice. Due to the heating while forming the crystalline burying layer by selective epitaxial growth and while epitaxially growing the contact layer or in a heat treatment after the epitaxial growth of the contact layer, dopant impurities diffuse from the first and third current blocking layers into the second cladding layer and the contact layer, respectively, whereby a thin portion of the second cladding layer in contact with the first current blocking layer and a thin portion of the contact layer in contact with the third current blocking layer are reversed to the first conductivity type. Accordingly, a p-n junction between the contact layer and the third current blocking layer moves from the regrowth interface between these layers to a position in the contact layer, and a p-n junction between the second cladding layer and the first current blocking layer moves from the regrowth interface between these layers to a position in the second cladding layer. Therefore, in the semiconductor laser device fabricated by this method, a reduction in a forward voltage of the p-n junction under continuous operation is avoided, preventing deterioration of laser characteristics, such as a rise in threshold current and a reduction in light output. Meanwhile, since the second current blocking layer includes impurities that are electrically neutral and interstitial in the crystal lattice, the neutral impurities prevent the dopant impurity from being interstitial in the crystal lattice. Consequently, the diffusion of the dopant impurities from the first and third current blocking layers into the second current blocking layer of the second conductivity type is suppressed, whereby deterioration of the current blocking effect of the current blocking layers due to a reduction of the charge carrier concentration of the second current blocking layer is prevented.

According to a fourth aspect of the present invention, in the described method of fabricating the semiconductor laser device, the selective epitaxial growth of the second current blocking layer in the crystalline burying layer forming process comprises successively growing a lower layer comprising a second conductivity type semiconductor including the impurities that are electrically neutral and interstitial in the crystal lattice, an intermediate layer comprising a semiconductor including only the dopant impurities, and an upper layer comprising a second conductivity type semiconductor including the impurities that are electrically neutral and interstitial in the crystal lattice. Therefore, in the semiconductor laser device fabricated by this method, deterioration of laser characteristics under continuous operation is prevented by the diffusion of the dopant impurities from the first and third current blocking layers to the second cladding layer and the contact layer, respectively. Meanwhile, since the upper and lower layers of the second current blocking layer including the neutral impurities are in contact with the third and first current blocking layers, respectively, the diffusion of the dopant impurities from the first and third current blocking layers to the second current blocking layer is suppressed, whereby a deterioration of the current blocking effect of the current blocking layers due to a reduction of the charge carrier concentration of the second current blocking layer is prevented. Although the neutral impurities tend to obstruct the activation of the dopant impurities in the second current blocking layer, the intermediate layer of the second current blocking layer includes the dopant impurities but it does not include the neutral impurities. Consequently, the charge carrier concentration is higher than when the neutral impurities are introduced into the entirety of the second current blocking layer as described above, whereby deterioration of the current blocking effect of the current blocking layers is further suppressed.

According to a fifth aspect of the present invention, a fabricating method of a semiconductor laser device includes successively epitaxially growing a first cladding layer comprising a p type semiconductor, an active layer, and a second cladding layer comprising an n type semiconductor on a front surface of a p type semiconductor substrate, depositing an insulating film on a region of the second cladding layer, selectively etching the first cladding layer, the active layer, and the second cladding layer using the insulating film as a mask to form a ridge waveguide, successively growing by selective epitaxial growth a first current blocking layer comprising a p type semiconductor having a charge carrier concentration higher than that of the second cladding layer, a second current blocking layer separated from the ridge waveguide by a portion of the first current blocking layer in the vicinity of the ridge waveguide and comprising an n type semiconductor, and a third current blocking layer comprising a p type semiconductor having a charge carrier concentration higher than that of a contact layer on both sides of the ridge waveguide to form a crystalline burying layer, removing the insulating film, and epitaxially growing a contact layer comprising an n type semiconductor on the second cladding layer and on the third current blocking layer. In the crystalline burying layer forming process, the second current blocking layer is selectively epitaxially grown to include impurities serving as hole traps. Due to the heating while forming the crystalline burying layer by selective epitaxial growth and while epitaxially growing the contact layer or in a the heat treatment after the epitaxial growth of the contact layer, dopant impurities diffuse from the first and third current blocking layers to the second cladding layer and the contact layer, respectively, whereby a thin portion of the second cladding layer in contact with the first current blocking layer and a thin portion of the contact layer in contact with the third current blocking layer are reversed to p type. Accordingly, a p-n junction between the contact layer and the third current blocking layer moves from the regrowth interface between these layers to a position in the contact layer, and a p-n junction between the second cladding layer and the first current blocking layer moves from the regrowth interface between these layers to a position in the second cladding layer. Therefore, in the semiconductor laser device fabricated by this method, a reduction in the forward voltage of the p-n junction under continuous operation is avoided, preventing deterioration of laser characteristics, such as a rise in threshold current and a reduction in light output. Meanwhile, since the second current blocking layer includes the impurities serving as hole traps, the diffusion of the holes from the first and third current blocking layers to the second current blocking layer of the n type semiconductor is suppressed, whereby deterioration of the current blocking effect of the current blocking layers is prevented.

According to a sixth aspect of the present invention, in the described method of fabricating the semiconductor laser device, the selective epitaxial growth of the second current blocking layer in the crystalline burying layer forming process comprises successively growing a lower layer comprising an n type semiconductor including the impurities serving as hole traps, an intermediate layer comprising a semiconductor including only dopant impurities, and an upper layer comprising an n type semiconductor including the impurities serving as hole traps. Therefore, in the semiconductor laser device fabricated by this method, as described above, deterioration of laser characteristics under continuous operation is prevented by the diffusion of dopant impurities from the first and third current blocking layers to the second cladding layer and the contact layer, respectively. Meanwhile, since the upper layer and the lower layer of the second current blocking layer including the impurities serving as the hole traps are in contact with the third and first current blocking layers, respectively, the diffusion of holes from the first and third current blocking layers into the second current blocking layer is suppressed by the upper and lower layers, whereby deterioration of the current blocking effect of the current blocking layers is prevented. Although the impurities serving as hole traps tend to obstruct the activation of the dopant impurities in the second current blocking layer, the intermediate layer of the second current blocking layer includes the dopant impurities but it does not include the impurities serving as hole traps. Consequently, the charge carrier concentration is higher than when the impurities serving as hole traps are introduced into the entirety of the second current blocking layer as described above, whereby the deterioration of the current blocking effect of the current blocking layers is further suppressed.

According to a seventh aspect of the present invention, a semiconductor laser device includes a ridge waveguide, a burying layer disposed on both sides of the ridge waveguide, and a contact layer disposed on the burying layer and the ridge waveguide. The burying layer comprises a first current blocking layer in contact with the side surface of the ridge waveguide and comprising a first conductivity type semiconductor, a second current blocking layer disposed on a portion of the first current blocking layer except in the vicinity of the ridge waveguide, separated from the ridge waveguide by the portion of the first current blocking layer in the vicinity of the ridge waveguide, and comprising a second conductivity type semiconductor, a third current blocking layer disposed on the portion of the first current blocking layer in the vicinity of the ridge waveguide and on the entire surface of second current blocking layer and comprising a first conductivity type semiconductor, and a final burying layer disposed on the third current blocking layer and comprising a second conductivity type semiconductor. The contact layer comprises a second conductivity type semiconductor. Therefore, since a p-n junction is not formed at the regrowth interface between the final burying layer and the contact layer, a reduction in the forward voltage of the p-n junction under continuous operation is avoided, preventing deterioration of laser characteristics, such as a rise in threshold current and a reduction in light output. Meanwhile, since the dopant impurities from the third current blocking layer of the first conductivity type semiconductor do not diffuse into the contact layer, the dopant impurities are not diffused from the first and third current blocking layers to the second current blocking layer of the second conductivity type, whereby there is no deterioration of the current blocking effect of the current blocking layers due to a reduction of the charge carrier concentration of the second current blocking layer.

According to an eighth aspect of the present invention, a semiconductor laser device includes a ridge waveguide, a burying layer disposed on both sides of the ridge waveguide, and a contact layer disposed over the entire surface of the burying layer and the ridge waveguide. The ridge waveguide comprises a first cladding layer comprising a first conductivity type semiconductor, an active layer disposed on the first cladding layer, and a second cladding layer disposed on the active layer, the main portion of the cladding layer comprising a second conductivity type semiconductor. The burying layer comprises a first current blocking layer in contact with the side surface of the ridge waveguide and comprising a first conductivity type semiconductor, a second current blocking layer disposed on a portion of the first current blocking layer, except in the vicinity of the ridge waveguide, separated from the ridge waveguide by the portion of the first current blocking layer in the vicinity of the ridge waveguide, and comprising a second conductivity type semiconductor, and a third current blocking layer disposed on the portion of the first current blocking layer in the vicinity of the ridge waveguide and on the entire surface of second current blocking layer and comprising the first conductivity type semiconductor. The main portion of the contact layer comprises a second conductivity type semiconductor. The first conductivity type semiconductor in the portion of the first current blocking layer in contact with the ridge waveguide has a charge carrier concentration higher than that of the second conductivity type semiconductor of the second cladding layer, and a thin portion of the second cladding layer in the vicinity of the interface between the second cladding layer and the first current blocking layer comprises the same first conductivity type semiconductor as the first current blocking layer. The first conductivity type semiconductor in the portion of the first current blocking layer in contact with the second current blocking layer has a charge carrier concentration lower than that of the first conductivity type semiconductor in the portion of the first current blocking layer in contact with the ridge waveguide. The first conductivity type semiconductor in the portion of the third current blocking layer in contact with the contact layer has a charge carrier concentration higher than that of the second conductivity type semiconductor in the main portion of the contact layer, and a thin portion of the contact layer in the vicinity of the interface between the contact layer and the third current blocking layer comprises the same first conductivity type semiconductor as the third current blocking layer. The first conductivity type semiconductor in the portion of the third current blocking layer in contact with the second current blocking layer has a charge carrier concentration lower than that of the first conductivity type semiconductor in the portion of the third current blocking layer in contact with the contact layer. Therefore, a p-n junction between the contact layer and the third current blocking layer is positioned in the contact layer, removed from the regrowth interface between these layers, and a p-n junction between the second cladding layer and the first current blocking layer is positioned in the second cladding layer, removed from the regrowth interface between these layers. Consequently, a reduction in the forward voltage of the p-n junction under continuous operation is avoided, preventing deterioration of laser characteristics, such as a rise in threshold current and a reduction in light output. Meanwhile, since the first conductivity type semiconductor in the portions of the first and third current blocking layers in contact with the second current blocking layer has a lower charge carrier concentration, dopant impurities diffusing from the first and third current blocking layers to the second current blocking layer are few, whereby deterioration of the current blocking effect of the current blocking layers due to a reduction in charge carrier concentration in the second current blocking layer is prevented.

According to a ninth aspect of the present invention, a semiconductor laser device includes a ridge waveguide, a burying layer disposed on both sides of the ridge waveguide, and a contact layer disposed on the burying layer and the ridge waveguide. The ridge waveguide comprises a first cladding layer comprising a first conductivity type semiconductor, an active layer disposed on the first cladding layer, and a second cladding layer disposed on the active layer, the main portion of the cladding layer comprising a second conductivity type semiconductor. The burying layer comprises a first current blocking layer in contact with the side surface of the ridge waveguide and comprising a first conductivity type semiconductor, a second current blocking layer disposed on a portion of the first current blocking layer except in the vicinity of the ridge waveguide, separated from the ridge waveguide by the portion of the first current blocking layer in the vicinity of the ridge waveguide, and comprising a second conductivity type semiconductor, and a third current blocking layer disposed on the portion of the first current blocking layer in the vicinity of the ridge waveguide and on the second current blocking layer and comprising a first conductivity type semiconductor. The main portion of the contact layer comprises the second conductivity type semiconductor. The first conductivity type semiconductor of the first current blocking layer has a charge carrier concentration higher than that of the second conductivity type semiconductor in the main portion of the second cladding layer, and a thin portion of the second cladding layer in the vicinity of the interface between the second cladding layer and the first current blocking layer comprises the same first conductivity type semiconductor as the first current blocking layer. The first conductivity type semiconductor of the third current blocking layer has a charge carrier concentration higher than that of the second conductivity type semiconductor in the main portion of the contact layer, and a thin portion of the contact layer in the vicinity of the interface between the contact layer and the third current blocking layer comprises the same first conductivity type semiconductor as the third current blocking layer. The second current blocking layer includes impurities that are electrically neutral and interstitial in the crystal lattice. Accordingly, a p-n junction between the contact layer and the third current blocking layer is positioned in the contact layer, removed from the regrowth interface between these layers, and a p-n junction between the second cladding layer and the first current blocking layer is positioned in the second cladding layer, removed from the regrowth interface between these layers. Therefore, a reduction in the forward voltage of the p-n junction under continuous operation is avoided, preventing deterioration of laser characteristics, such as a rise in threshold current and a reduction in light output. Meanwhile, since the second current blocking layer includes the impurities that are electrically neutral and interstitial in the crystal lattice, the neutral impurities prevent the dopant impurities from diffusing into the crystal lattice. Consequently, the diffusion of the dopant impurities from the first and third current blocking layers to the second current blocking layer of the second conductivity type is suppressed, whereby deterioration of the current blocking effect of the current blocking layers due to a reduction of the charge carrier concentration of the second current blocking layer is prevented.

According to a tenth aspect of the present invention, in the semiconductor laser device, the impurities that are electrically neutral are included only in thin layer portions of the second current blocking layer in contact with the first and third current blocking layers. Therefore, since a thin portion of the second cladding layer and the contact layer in contact with the first and third current blocking layers, respectively, is of the first conductivity type, deterioration of laser characteristics under continuous operation is prevented as described above. Meanwhile, since the thin layer portions of the second current blocking layer including the neutral impurities are in contact with the first and third current blocking layers, the diffusion of the dopant impurities from the first and third current blocking layers to the second current blocking layer is suppressed, whereby deterioration of the current blocking effect of the current blocking layers due to a reduction of charge carrier concentration in the second current blocking layer is prevented. Although the neutral impurities tend to obstruct the activation of the dopant impurities in the second current blocking layer, a portion of the second current blocking layer, except the thin layer portions, includes the dopant impurities but does not include the neutral impurities. Consequently, the charge carrier concentration is higher than when the neutral impurities are introduced into the entirety of the second current blocking layer as described above, whereby the deterioration of the current blocking effect of the current blocking layers is further suppressed.

According to an eleventh aspect of the present invention, a semiconductor laser device includes a ridge waveguide, a crystalline burying layer disposed on both sides of the ridge waveguide, and a contact layer disposed on the crystalline burying layer and the ridge waveguide. The ridge waveguide comprises a first cladding layer comprising a p type semiconductor, an active layer disposed on the first cladding layer, and a second cladding layer disposed on the active layer, the main portion of the cladding layer comprising an n type semiconductor. The crystalline burying layer comprises a first current blocking layer in contact with the side surfaces of the ridge waveguide and comprising a p type semiconductor, a second current blocking layer disposed on a portion of the first current blocking layer, except in the vicinity of the ridge waveguide, separated from the ridge waveguide by the portion of the first current blocking layer in the vicinity of the ridge waveguide, and comprising an n type semiconductor, and a third current blocking layer disposed on the portion of the first current blocking layer in the vicinity of the ridge waveguide and on the second current blocking layer and comprising a p type semiconductor. The main portion of the contact layer comprises an n type semiconductor. The p type semiconductor of the first current blocking layer has a charge carrier concentration higher than that of the n type semiconductor in the main portion of the second cladding layer, and a thin portion of the second cladding layer in the vicinity of the interface between the second cladding layer and the first current blocking layer comprises the same p type semiconductor as the first current blocking layer. The p type semiconductor of the third current blocking layer has a charge carrier concentration higher than that of the n type semiconductor in the main portion of the contact layer, and a thin portion of the contact layer in the vicinity of the interface between the contact layer and the third current blocking layer comprises the same p type semiconductor as the third current blocking layer. The second current blocking layer includes impurities serving as hole traps. Therefore, a p-n junction between the contact layer and the third current blocking layer is positioned in the contact layer, removed from the regrowth interface between these layers, and a p-n junction between the second cladding layer and the first current blocking layer is positioned in the second cladding layer, removed from the regrowth interface between these layers. Consequently, a reduction in the forward voltage of the p-n junction under continuous operation is avoided, preventing deterioration of laser characteristics, such as a rise in threshold current and a reduction in light output. Meanwhile, since the second current blocking layer includes the impurities serving as hole traps, the diffusion of holes from the first and third current blocking layers to the second n type current blocking layer is suppressed, whereby deterioration of the current blocking effect of the current blocking layers is prevented.

According to a twelfth aspect of the present invention, in the semiconductor laser device, the impurities serving as the hole traps are included only in thin layer portions of the second current blocking layer in contact with the first and third current blocking layers. Therefore, since a thin portion of the second cladding layer and the contact layer in contact with the first and third current blocking layers, respectively, has the first conductivity type, deterioration of laser characteristics under continuous operation is prevented as described above. Meanwhile, since the thin layer portions of the second current blocking layer including the impurities serving as hole traps are in contact with the first and third current blocking layers, the diffusion of holes from the first and third current blocking layers to the second current blocking layer is suppressed, whereby deterioration of the current blocking effect of the current blocking layers is prevented. Although the impurities serving as hole traps tend to obstruct the activation of dopant impurities in the second current blocking layer, a portion of the second current blocking layer includes the dopant impurities but does not include the impurities serving as hole traps. Consequently, the charge carrier concentration is higher than when the impurities serving as hole traps are introduced into the entirety of the second current blocking layer as described above, whereby the deterioration of the current blocking effect of the current blocking layers is further suppressed.

BRIEF DESCRIPTION OF THE DRAWINGS

FIGS. 5 (a)–5 (e) are sectional views illustrating process steps in a method of fabricating a semiconductor laser device in accordance with a third embodiment of the present invention.

DETAILED DESCRIPTION OF THE PREFERRED EMBODIMENTS

Embodiment 1

Figure 1:
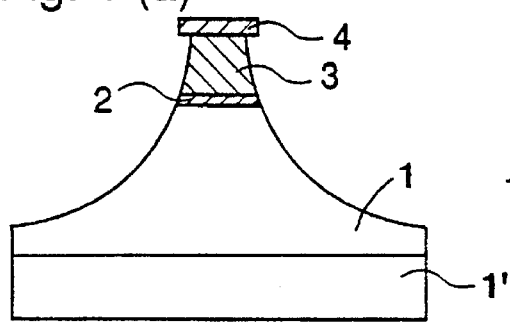
FIGS. 1 (a)–1 (f) are sectional views illustrating process steps in a method of fabricating a semiconductor laser device in accordance with a first embodiment of the present invention.
Figure 1:
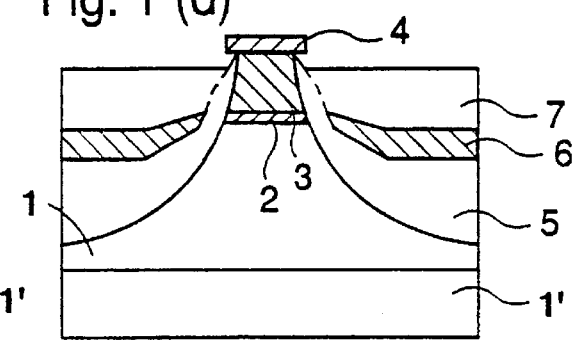
Figure 1:
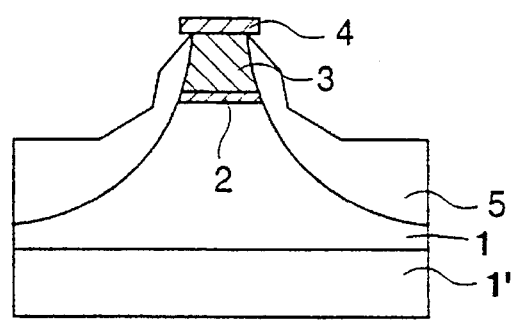
Figure 1:
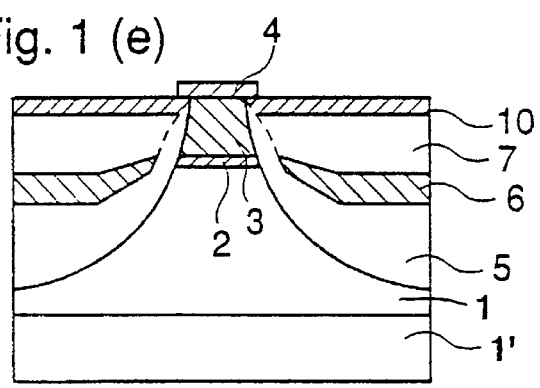
Figure 1:
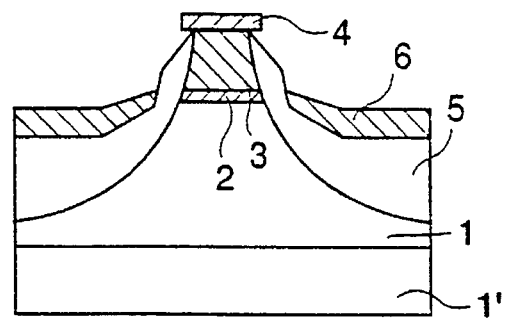
Figure 1:
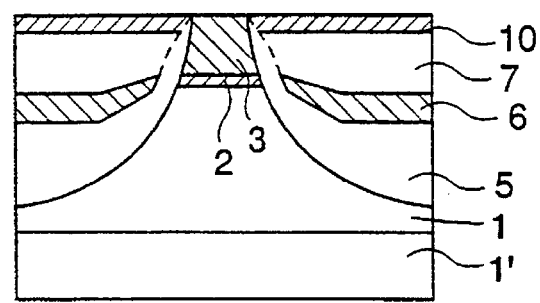

FIGS. 1 (a)–1 (f) are sectional views illustrating process steps in a method of fabricating a semiconductor laser device according to a first embodiment of the invention. Initially, a p type InP first cladding layer 1 having a thickness of about 1 μm, an undoped InGaAsP active layer 2 having a thickness of about 0.1 μm, and an n type InP second cladding layer 3 having a thickness of about 1 μm are successively epitaxially grown on a p type InP substrate 1, preferably by metal organic chemical vapor deposition (hereinafter referred to as MOCVD). Thereafter, a selective growth mask 4 comprising an SiO film and having a thickness of about 0.1 μm is formed on a portion of the n type InP second cladding layer 3 and, using the selective growth mask 4, the first cladding layer 1, the undoped InGaAsP active layer 2, and the second cladding layer 3 are selectively etched to form a ridge waveguide (FIG. 1 (a)).

A p type InP first current blocking layer 5 having a thickness of about 1 μm (FIG. 1 (b)), an n type InP second current blocking layer 6 having a thickness of about 1 μm FIG. 1 (c)), a p type InP third current blocking layer 7 having a thickness of about 1 μm FIG. 1 (d)), and an n type InP final burying layer 10 having a thickness of about 0.2 μm FIG. 1 (e)) are successively grown by selective epitaxial growth, preferably using MOCVD, to form a crystalline burying layer. In the step of FIG. 1 (f), after removal of the selective growth mask 4, an n type InP contact layer 8 having a thickness of about 2 μm is epitaxially grown on the entire surface of the final burying layer 10. In this growth step, the n type InP contact layer 8 has the same charge carrier concentration and composition as the n type InP final burying layer 10. Finally, the rear surface of the substrate is ground, and an electrode 20b comprising Cr/Au and having a thickness of about 0.2 μm and an electrode 20a comprising AuZn/Au and having a thickness of about 0.2 μm are formed on the n type InP contact layer 8 and on the ground rear surface of the substrate, respectively, completing the semiconductor laser device shown in FIG. 2.

The first and second cladding layers 1 and 3 and the first, second, and third current blocking layers 5, 6, and 7 have a charge carrier concentration of about $10^{18}$ cm$^{-3}$, and the n type InP contact layer 8 has a charge carrier concentration exceeding $10^{18}$ cm$^{-3}$. Preferably, Zn is employed as the dopant impurity producing p type conductivity, and Si or S is employed as the dopant impurity producing n type conductivity.

Figure 2:
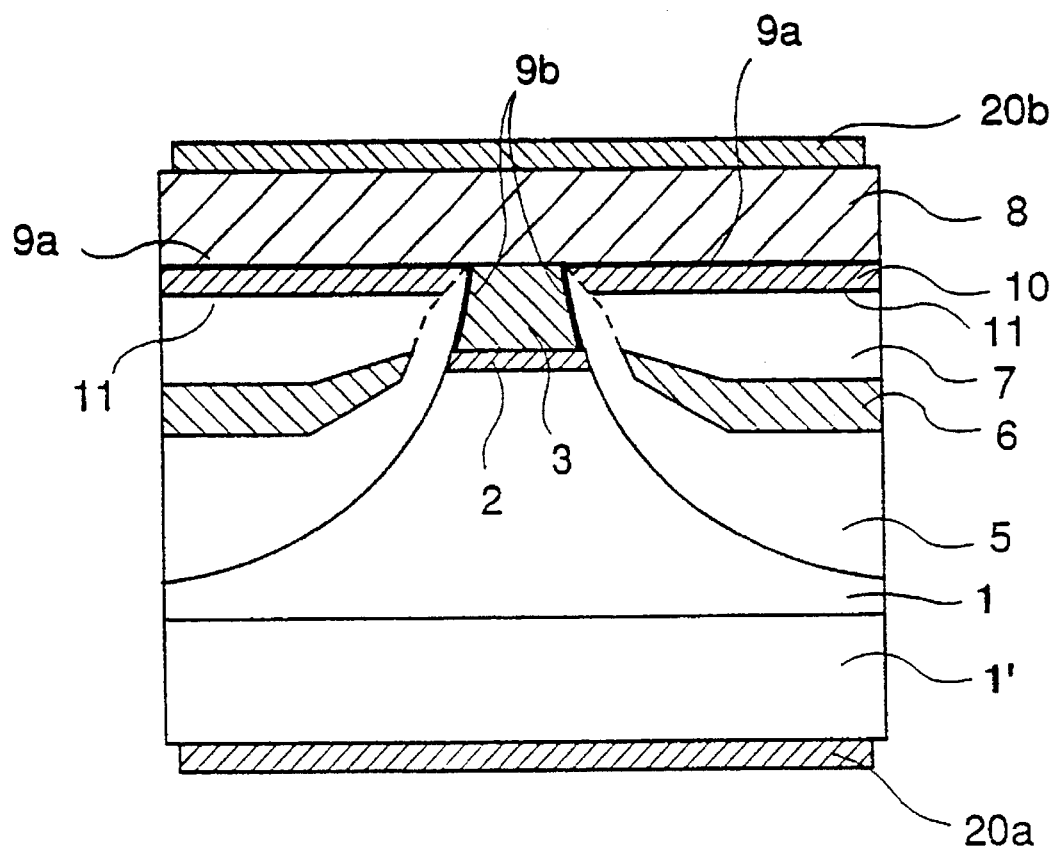
FIG. 2 is a sectional view illustrating a semiconductor laser device in accordance with the first embodiment of the invention.

In a semiconductor laser device fabricated using the method of the first embodiment, as shown in FIG. 2, a p-n junction 11 of the upper portion of the current blocking layers is located at the interface between the p type InP third current blocking layer 7 and the n type InP final burying layer 10. This interface is not the regrowth interface. On the other hand, a junction between the n type layers is located at the interface 9a between the n type InP final burying layer 10 and the n type InP contact layer 8, i.e., the regrowth interface of the upper portion of the burying layer. Therefore, in the p-n junction between the p type third current blocking layer 7 and the n type final burying layer 10, the forward voltage is not reduced under continuous operation, so there is no deterioration of the laser characteristics.

In the first embodiment of the invention, since the n type InP final burying layer 10 is employed, a p-n junction is not located at the regrowth interface 9a of the upper portion of the burying crystal, and the diffusion of dopant impurities as in the conventional fabricating method does not occur. Therefore, a reduction in the charge carrier concentration of the n-type InP second current blocking layer 6 and a reduction in the current blocking effect of the current blocking layers due to the diffusion of dopant impurities producing p type conductivity into the n type second current blocking layer 6 do not occur. In this first embodiment, the substrate is heated during the epitaxial growth steps to a temperature at which the diffusion of the dopant impurities producing p type conductivity does not occur, or the p type first and third current blocking layers 5 and 7 have charge carrier concentrations in which the conductivity type of the n type layers surrounding the p type first and third current blocking layers is not reversed to p type.

Meanwhile, since the interface 9b between the n type InP second cladding layer 3 and the p type InP first current blocking layer 5 is a portion of the side surface of the ridge waveguide and is the regrowth interface of the side surface of the second cladding layer 3 and the p-n junction is located there, it is possible to reduce the forward voltage under continuous operation.

In addition, in this first embodiment of the invention, although an InP semiconductor laser device is described, the same fabricating method and the same structure may be adopted in a semiconductor laser device comprising another material, such as GaAs. The number of current blocking layers need not be three Embodiment 2

Figure 3:
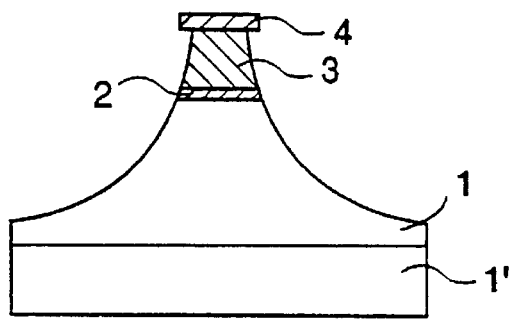
FIGS. 3 (a)–3 (e) are sectional views illustrating process steps in a method of fabricating a semiconductor laser device in accordance with a second embodiment of the present invention.
Figure 3:
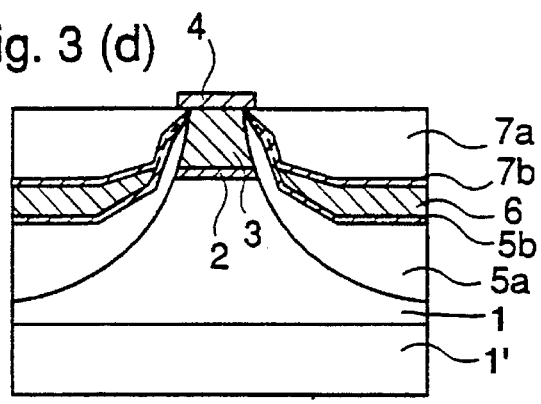
Figure 3:
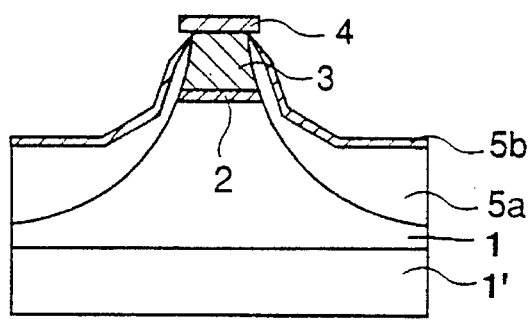
Figure 3:
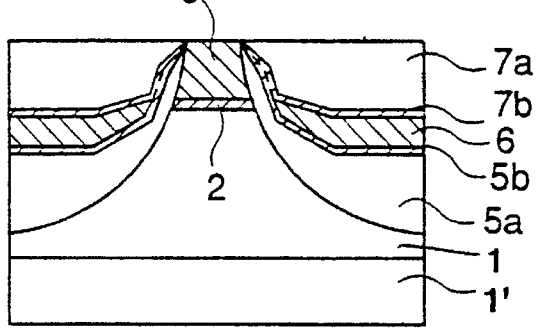
Figure 3:
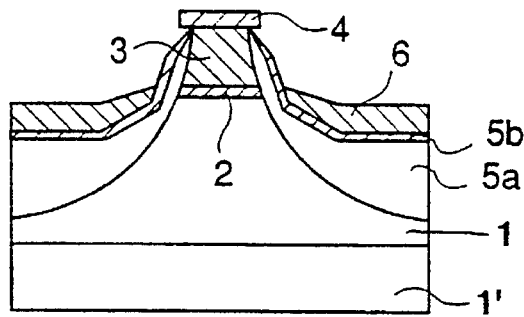

FIGS. 3 (a)–3 (e) are sectional views illustrating process seeps in a method of fabricating a semiconductor laser device according to a second embodiment of the invention. Initially, as shown in FIG. 3 (a), a ridge waveguide comprising a p type InP first cladding layer 1, an undoped InGaAsP active layer 2, and an n type InP second cladding layer 3 is formed by the same method as in the first embodiment of the invention. Then, a lower layer 5a of a p type InP first current blocking layer having a high charge carrier concentration and a thin upper layer 5b of a p type InP first current blocking layer having a low charge carrier concentration are successively grown by selective epitaxial growth (FIG. 3 (b)). Further, an n type InP second current blocking layer 6 is selectively epitaxially grown (FIG. 3 (c)).

In the step of FIG. 3 (d), a thin lower layer 7b of a p type InP third current blocking layer having a low charge carrier concentration and an upper layer 7a of a p type InP third current blocking layer having a high charge carrier concentration are successively grown by selective epitaxial growth to form a crystalline burying layer comprising the first, second, and third current blocking layers. The growth of these current blocking layers is continuous, preferably using MOCVD. Then, as shown in FIG. 3 (e), the selective growth mask 4 is removed. Finally, as in the first embodiment of the invention, an n type InP contact layer 8 is epitaxially grown on the entire surface of the upper layer 7a, the rear surface of the substrate 1' is ground, and an electrode 20b and an electrode 20a are formed on the n type InP contact layer 8 and on the ground rear surface of the substrate, respectively, completing the semiconductor laser device shown in FIG. 4.

In this case, the lower layer 5a of the p type InP first current blocking layer has a higher charge carrier concentration than the n type InP second cladding layer 3, and the upper layer 7a of the p type InP third current blocking layer has a higher charge carrier concentration than the n type InP contact layer 8. Therefore, when the substrate is heated during the epitaxial growth steps to a suitable temperature, dopant impurities producing p type conductivity diffuse from the lower layer 5a of the first current blocking layer and the upper layer 7a of the third current blocking layer into the second cladding layer 3 and the contact layer 8. The conductivity type of a thin portion of the second cladding layer 3 and the contact layer 8 comprising n type InP in contact with the current blocking layers are reversed to p type. In addition, this diffusion may be produced by heat treatment after the epitaxial growth.

Figure 4:
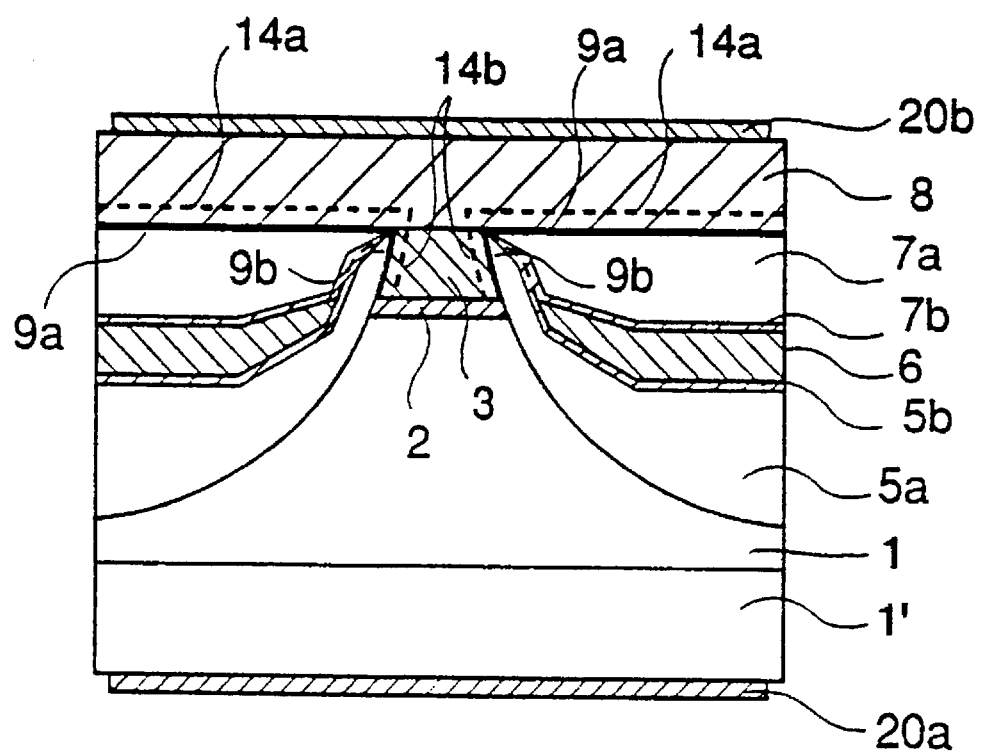
FIG. 4 is a sectional view illustrating a semiconductor laser device in accordance with the second embodiment of the invention.

In the second embodiment of the invention, as shown in FIG. 4, due to the diffusion of the dopant impurities producing p type conductivity, a p-n junction between the upper layer 7a of the third current blocking layer and the contact layer 8, i.e., a p-n junction with the upper portion of the burying layer, is located at a position 14a in the contact layer 8, removed from the interface 9a between the upper layer 7a of the current blocking layer and the contact layer 8, i.e., the regrowth interface of the upper portion of the burying layer. Likewise, a p-n junction between the lower layer 5a of the first current blocking layer and the second cladding layer 3, i.e., a p-n junction with the side surface of the second cladding layer 3, is located at a position 14b in the second cladding layer 3, removed from the interface 9b between the lower layer 5a of the current blocking layer and the second cladding layer 3, i.e., the regrowth interface on the side surface of the second cladding layer 3. Therefore, as described above, in these p-n junctions, forward voltage is not reduced under continuous operation, so there is no deterioration of the laser characteristics.

Meanwhile, since the upper layer 5b of the first current blocking layer and the lower layer 7b of the third current blocking layer comprising p type InP in contact with the n type InP second current blocking layer 6 have lower charge carrier concentrations than the lower layer 5a of the first current blocking layer and the upper layer 7a of the third current blocking layer, respectively, the dopant impurities producing p type conductivity that diffuse into the second current blocking layer 6 are few. Therefore, a reduction in charge carrier concentration of the n type InP second current blocking layer 6 due to compensation by the dopant impurities producing p type conductivity is suppressed, whereby the current blocking effect of the current blocking layers is not deteriorated.

In the second embodiment of the invention, the deterioration of laser characteristics under continuous operation is prevented without reducing the current blocking effect of the current blocking layers. In addition, although an InP semiconductor laser device is described, the same fabricating method and the same structure may be adopted in a semiconductor laser device comprising another material, such as GaAs. The number of current blocking layers need not be three.

Embodiment 3

FIGS. 5 (a)–5 (e) are sectional views illustrating process steps in a method of fabricating a semiconductor laser device according to a third embodiment of the invention. Initially, as shown in FIG. 5 (a), a ridge waveguide comprising a p type InP first cladding layer 1, an undoped InGaAsP active layer 2, and an n type InP second cladding layer 3 is formed by the same method as in the first embodiment of the invention. Then, a p type InP first current blocking layer 12 having a high charge carrier concentration is selectively epitaxially grown (FIG. 5 (b)). In the step of FIG. 5 (c), an n type InP second current blocking layer 15 including dopant impurities producing n type conductivity and impurities that are electrically neutral and interstitial in the crystal lattice, such as Co and Ti, is selectively epitaxially grown. Further, a p type InP third current blocking layer 13 having a high charge carrier concentration is selectively epitaxially grown to form a crystalline burying layer comprising the first, second, and third current blocking layers (FIG. 5 (d)). The growth of these current blocking layers is performed continuously, preferably using MOCVD. Then, as shown in FIG. 5 (e), the selective growth mask 4 is removed.

Figure 6:
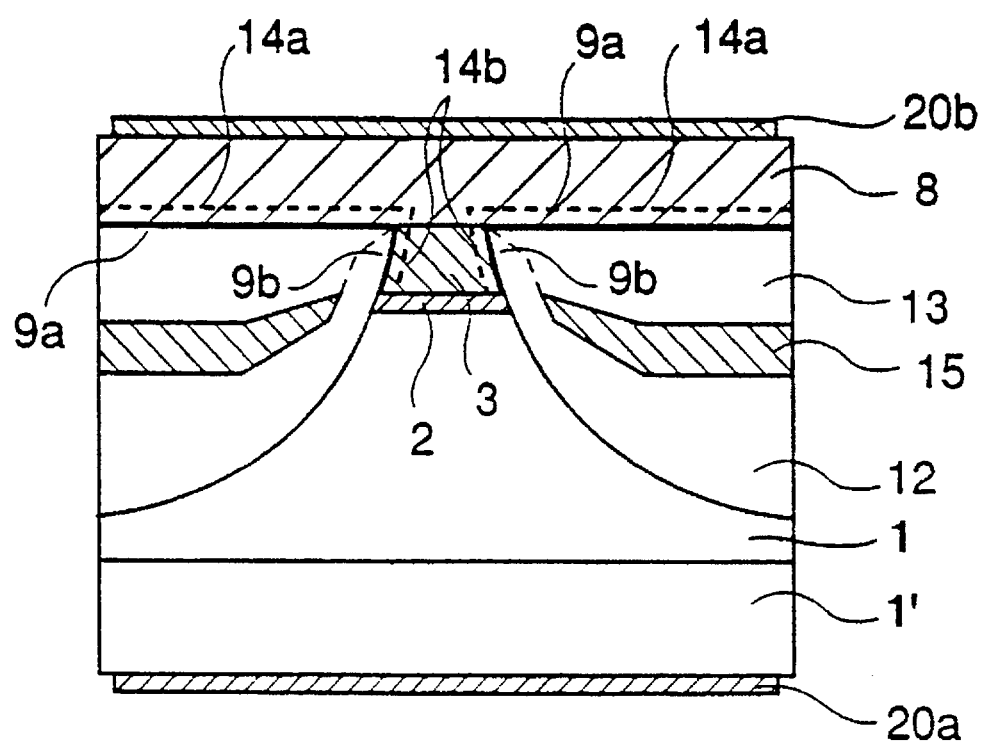
FIG. 6 is a sectional view illustrating a semiconductor laser device in accordance with the third embodiment of the invention.

Finally, similar to the first embodiment of the invention, an n type InP contact layer 8 is epitaxially grown over the entire surface of the current blocking layer 13, the rear surface of the substrate is ground, and an electrode 20b and an electrode 20a are formed on the n type InP contact layer 8 and on the ground rear surface of the substrate, respectively, completing the semiconductor laser device shown in FIG. 6. In this case, the p type InP first current blocking layer 12 has a higher charge carrier concentration than the n type InP second cladding layer 3, and the p type InP third current blocking layer 13 has a higher charge carrier concentration than the n type InP contact layer 8. Therefore, when the substrate is heated during epitaxial growth to a suitable temperature, dopant impurities producing p type conductivity diffuse from the first and third current blocking layers 12 and 13 into the second cladding layer 3 and the contact layer 8. The conductivity type of a thin portion of the second cladding layer 3 and the contact layer 8, comprising n type InP, in contact with the current blocking layers is reversed to p type. In addition, this diffusion may be carried out by heat treatment after the epitaxial growth.

Also, as shown in FIG. 6, due to the diffusion of the dopant impurities producing p type conductivity, a p-n junction between the third current blocking layer 13 and the contact layer 8, i.e., a p-n junction with the upper portion of the crystalline burying layer, is formed at a position 14a in the contact layer 8, removed from the interface 9a between the third current blocking layer 13 and the contact layer 8, i.e., the regrowth interface of the upper portion of the burying crystal. Likewise, a p-n junction between the first current blocking layer 12 and the second cladding layer 3, i.e., a p-n junction with the side surface of the second cladding layer 3, is formed at a position 14b in the second cladding layer 3, removed from the interface 9b between the first current blocking layer 12 and the second cladding layer 3, i.e., the regrowth interface of the side surface of the second cladding layer 3. Therefore, the forward voltage of these p-n junctions is not reduced under continuous operation and does not cause the deterioration of laser characteristics.

Meanwhile, although the dopant impurities diffused from the p type InP first and third current blocking layers 12 and 13 into the n type InP second current blocking layer 15 are interstitial in the crystal lattice, since the second current blocking layer 15 includes impurities that are electrically neutral and interstitial in the crystal lattice, the diffusion of the dopant impurities is suppressed. Therefore, a reduction in the charge carrier concentration of the second current blocking layer 15 due to compensation by the dopant impurities producing p type conductivity of the dopant impurities producing n type conductivity in the second current blocking layer 15 is significantly suppressed, and the current blocking effect of the current blocking layers is not deteriorated.

In the third embodiment of the invention, the deterioration of the laser characteristics under continuous operation is prevented without reducing the current blocking effect of the current blocking layers. In addition, although an InP semiconductor laser device is described, the same fabricating method and the same structure may be adopted in a semiconductor laser device comprising another material, such as GaAs. The number of current blocking layers need not be three.

Embodiment 4

Figure 7:
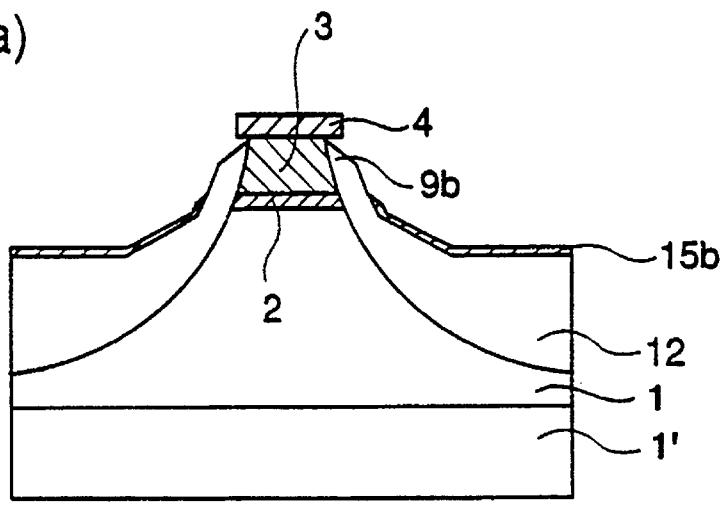
FIGS. 7 (a)–7 (c) are sectional views illustrating process steps in a method of fabricating a semiconductor laser device in accordance with a fourth embodiment of the present invention.
Figure 7:
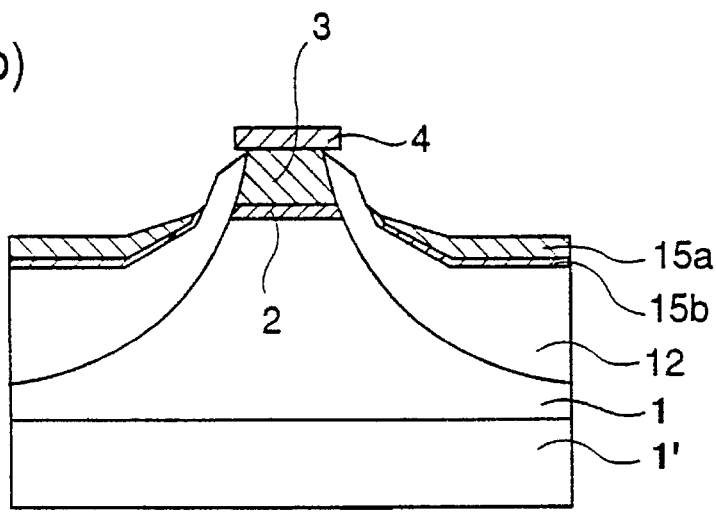
Figure 7:
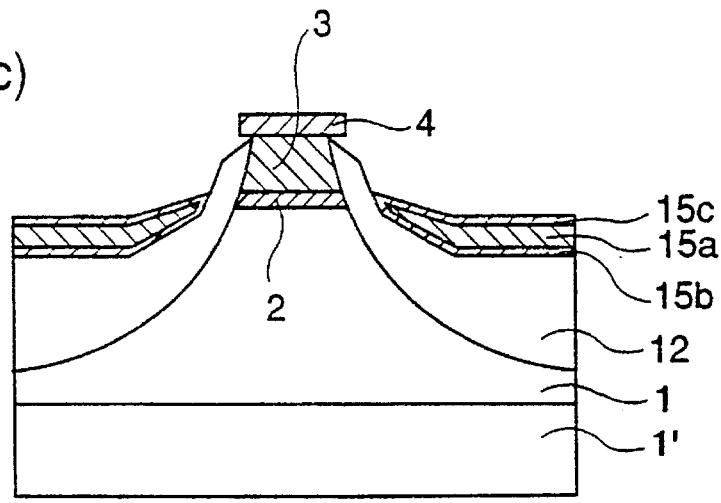

FIGS. 7 (a)–7 (c) are sectional views illustrating process steps In a method of fabricating a semiconductor laser device according to a fourth embodiment of the invention. Initially, as in the third embodiment of the invention, after the formation of a ridge waveguide comprising a p type InP first cladding layer 1, an undoped InGaAsP active layer 2, and an n type InP second cladding layer 3, a p type InP first current blocking layer 12 having a high charge carrier concentration is selectively epitaxially grown. Then, a thin lower layer 15b of an n type InP second current blocking layer including dopant impurities producing n type conductivity and impurities that are electrically neutral and interstitial in the crystal lattice, such as Co and Ti, is selectively epitaxially grown (FIG. 7 (a)). Further, an intermediate layer 15a of an n type InP second current blocking layer including dopant impurities producing n type conductivity is selectively epitaxially grown (FIG. 7 (b)). In the step of FIG. 7 (c), a thin upper layer 15c of an n type InP second current blocking layer including dopant impurities producing n type conductivity and impurities that are electrically neutral and interstitial in the crystal lattice, such as Co and Ti, is selectively epitaxially grown.

The following processes are the same as those in the third embodiment of the invention. A p type InP third current blocking layer 13 having a high charge carrier concentration is selectively epitaxially grown to form a crystalline burying layer comprising the first, second, and third current blocking layers. After removal of the selective growth mask 4, an n type InP contact layer 8 is epitaxially grown on the current blocking layer 13, the rear surface of the substrate is ground, and an electrode 20b and an electrode 20a are formed on the n type InP contact layer 8 and on the ground rear surface of the substrate, respectively, completing the semiconductor laser device shown in FIG. 8. In addition, the growth of the current blocking layers is performed continuously, preferably using MOCVD.

In this case, the p type InP first current blocking layer 12 has a higher charge carrier concentration than the n type InP second cladding layer 3, and the p type InP third current blocking layer 13 has a higher charge carrier concentration than the n type InP contact layer 8. Therefore, when the substrate is heated during epitaxial growth, dopant impurities producing p type conductivity diffuse from the first and third current blocking layers 12 and 13 to the second cladding layer 3 and the contact layer 8, and the conductivity type of a thin portion of the second cladding layer 3 and the contact layer 8, comprising n type InP, in contact with the current blocking layers is reversed to p type. In addition, this diffusion may be carried out by heat treatment after the epitaxial growth.

Figure 8:
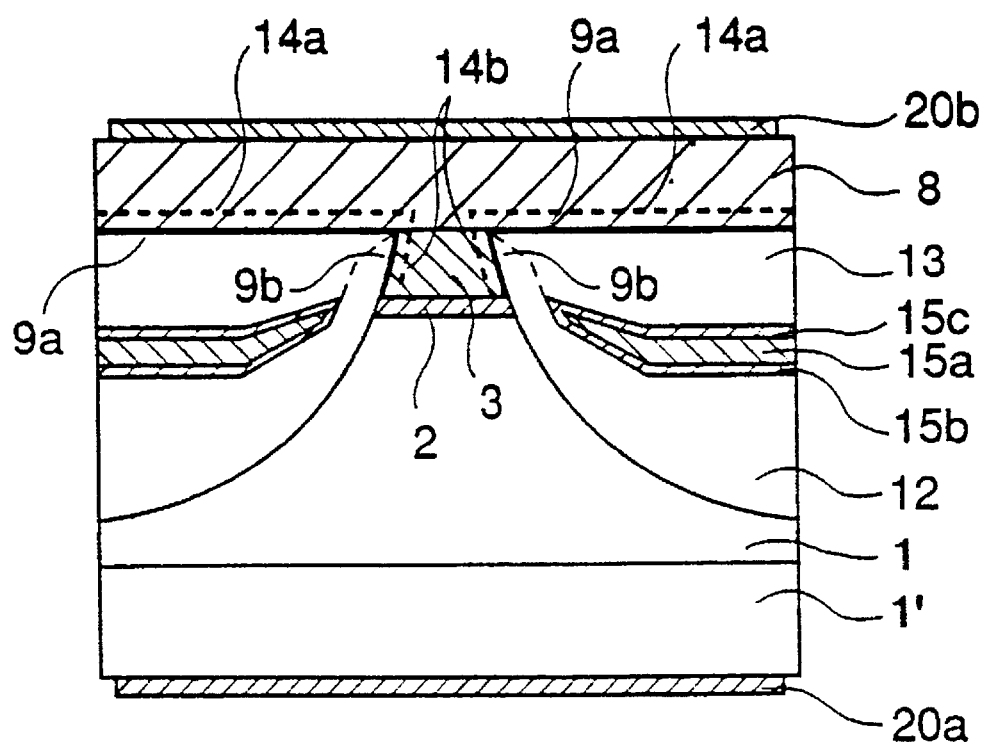
FIG. 8 is a sectional view illustrating a semiconductor laser device in accordance with the fourth embodiment of the invention.

In the fourth embodiment of the invention, as shown in FIG. 8, due to the diffusion of the dopant Impurities producing p type conductivity, a p-n junction between the third current blocking layer 13 and the contact layer 8, i.e., a p-n junction with the upper portion of the crystalline burying layer, is formed at a position 14a in the contact layer 8, removed from the interface 9a between the third current blocking layer 13 and the contact layer 8, i.e., the regrowth interface of the upper portion of the crystalline burying layer. Likewise, a p-n junction between the first current blocking layer 12 and the second cladding layer 3, i.e., a p-n junction with the side surface of the second cladding layer 3, is formed at a position 14b in the second cladding layer 3, removed from the interface 9b between the first current blocking layer 12 and the second cladding layer 3, i.e., the regrowth interface of the side surface of the second cladding layer 3. Therefore, as described above, in these p-n junctions, the forward voltage is not reduced under continuous operation, avoiding deterioration of laser characteristics.

Meanwhile, although the dopant impurities producing p type conductivity that diffuse from the p type InP first and third current blocking layers 12 and 13 into the n type InP second current blocking layer 15 are interstitial in the crystalline lattice, since the upper layer 15c and the lower layer 15b of the second current blocking layer in contact with the third and the first current blocking layers 13 and 12, respectively, include impurities that are electrically neutral and interstitial in the crystalline lattice, the diffusion of the dopant impurities is suppressed. Therefore, a reduction in the charge carrier concentration of the second current blocking layer 15 due to compensation by the dopant impurities is significantly suppressed. Although the neutral impurities tend to obstruct the activation of the dopant impurities in the second current blocking layer, the intermediate layer 15a of the second current blocking layer includes dopant impurities producing n type conductivity but it does not include the neutral impurities. Consequently, the charge carrier concentration is higher than when the neutral impurities are introduced into the entirety of the second current blocking layer 15 as in the third embodiment of the invention, whereby deterioration of the current blocking effect of the current blocking layers is further suppressed.

In the fourth embodiment of the invention, deterioration of laser characteristics under continuous operation is prevented without reducing the current blocking effect of the current blocking layers.

In addition, although an InP semiconductor laser device is described, the same fabricating method and the same structure may be adopted in a semiconductor laser device comprising another material, such as GaAs. The number of current blocking layers need not be three.

Embodiment 5

Figure 9:
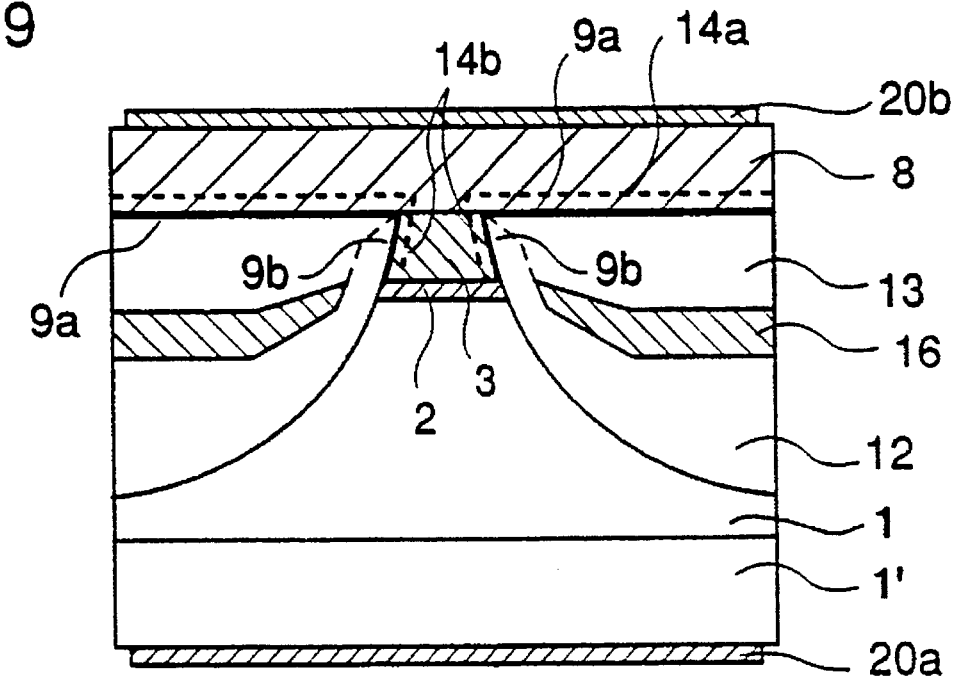
FIG. 9 is a sectional view illustrating a semiconductor laser device in accordance with a fifth embodiment of the present invention.

FIG. 9 is a sectional view illustrating a semiconductor laser device according to a fifth embodiment of the invention. In the figure, reference numeral 16 designates an n type InP second current blocking layer including dopant impurities and impurities serving as hole traps. In this semiconductor laser device, the impurities serving as hole traps substitute for the impurities that are electrically neutral and interstitial in the crystalline lattice that are included in the n type InP second current blocking layer 16 in the third embodiment of the invention. A fabricating method according to the fifth embodiment of the invention is the same as in the third embodiment, except that InP is grown to include dopant impurities producing n type conductivity and impurities serving as hole traps, such as Co, during the epitaxial growth of the second current blocking layer 16. In this case, the p type InP first current blocking layer 12 has a higher charge carrier concentration than the n type InP second cladding layer 3, and the p type InP third current blocking layer 13 has a higher charge carrier concentration than the n type InP contact layer 8. Therefore, when the substrate is heated during epitaxial growth to a suitable temperature, dopant impurities producing p type conductivity diffuse from the first and third current blocking layers 12 and 13 into the second cladding layer 3 and the contact layer 8, and the conductivity type of a thin portion of the second cladding layer 3 and the contact layer 8 comprising n type InP in contact with the current blocking layers is reversed to p type. In addition, this diffusion may be carried out by heat treatment after the epitaxial growth.

In the fifth embodiment of the invention, as shown in FIG. 9, due to the diffusion of the dopant impurities, a p-n junction between the third current blocking layer 13 and the contact layer 8, i.e., a p-n junction with the upper portion of the burying layer, is formed at a position 14a in the contact layer 8 removed from the interface 9a between the third current blocking layer 13 and the contact layer 8, i.e., the regrowth interface of the upper portion of the burying layer.

Likewise, a p-n junction between the first current blocking layer 12 and the second cladding layer 3, i.e., a p-n junction with the side surface of the second cladding layer 3, is formed at a position 14b in the second cladding layer 3 removed from the interface 9b between the first current blocking layer 12 and the second cladding layer 3, i.e., the regrowth interface of the side surface of the second cladding layer 3. Therefore, as described above, in these p-n junctions, the forward voltage is not reduced under continuous operation, so there is no deterioration of laser characteristics.

Meanwhile, since the second current blocking layer 16 includes the impurities serving as hole traps, the diffusion of the holes from the p type InP first and third current blocking layers 12 and 13 to the n type InP second current blocking layer 16 is suppressed, whereby the current blocking effect of the current blocking layers is not deteriorated.

In the fifth embodiment of the invention, the deterioration of the laser characteristics under continuous operation is prevented without reducing the current blocking effect of the current blocking layers.

In addition, although an InP semiconductor laser device is described, the same fabricating method and the same structure may be adopted in a semiconductor laser device comprising another material, such as GaAs. The number of current blocking layers need not be three.

Embodiment 6

Figure 10:
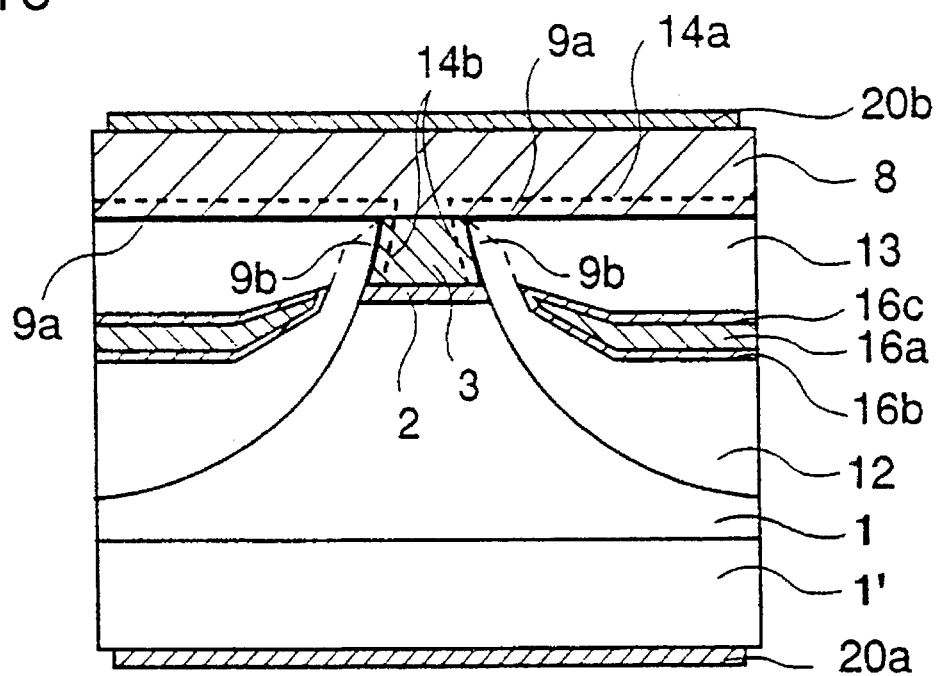
FIG. 10 is a sectional view illustrating a semiconductor laser device in accordance with a sixth embodiment of the present invention.
Figure 11:
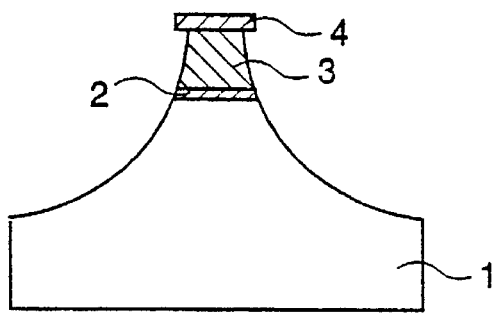
FIGS. 11 (a)–11 (e) are sectional views illustrating process steps in a method of fabricating a semiconductor laser device according to the prior art.
Figure 11:
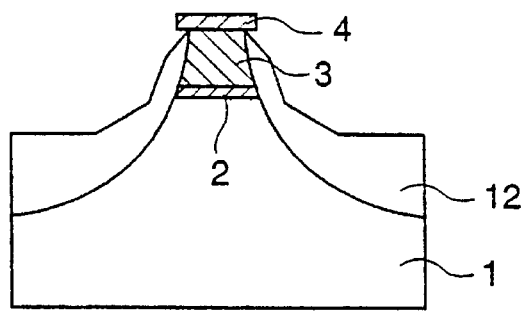
Figure 11:
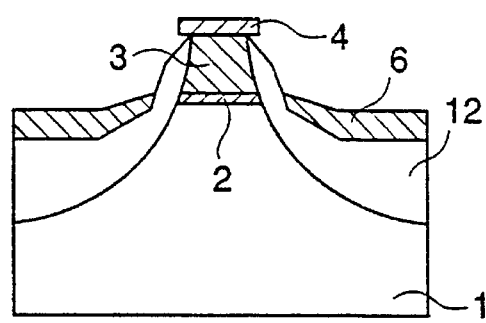
Figure 11:
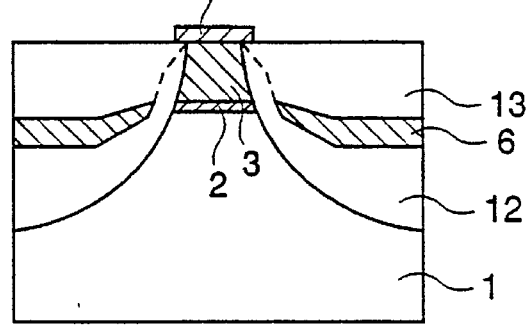
Figure 11:
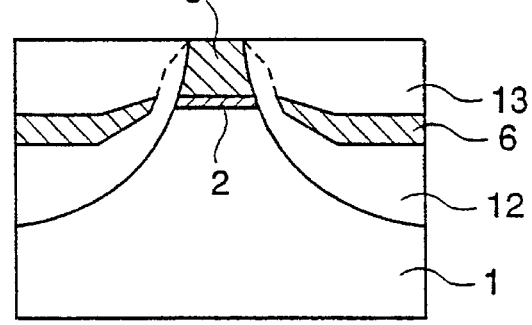
Figure 12:
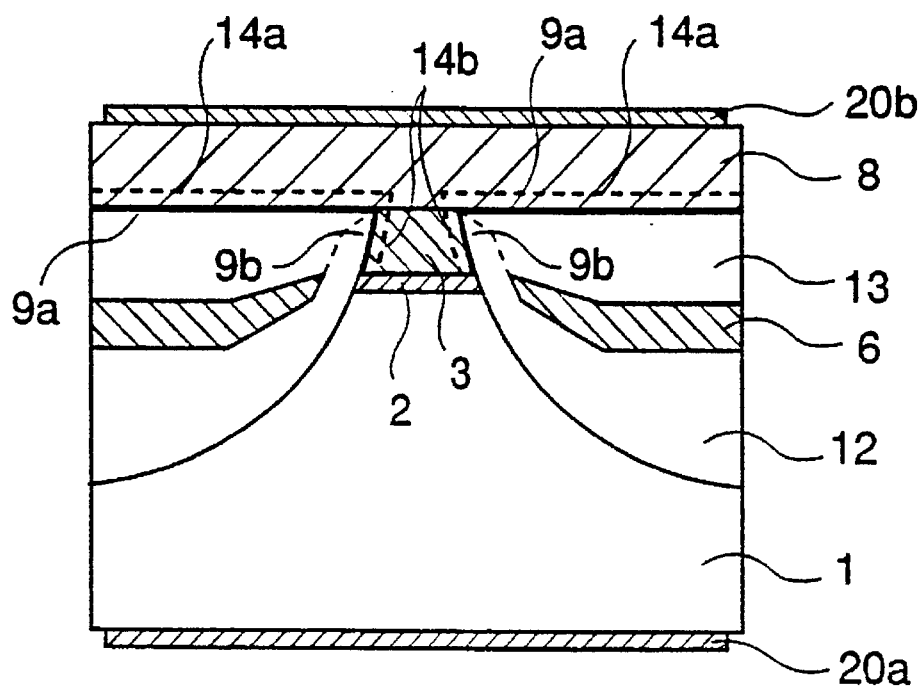
FIG. 12 is a sectional view illustrating a semiconductor laser device according to the prior art.

FIG. 10 is a sectional view illustrating a semiconductor laser device according to a sixth embodiment of the invention. In the figure, reference numerals 16b and 16c designate a lower layer and an upper layer of an n type InP second current blocking layer including dopant impurities and impurities serving as hole traps, respectively, and numeral 16a designates an intermediate layer of an n type InP second current blocking layer including only dopant impurities. In this semiconductor laser device, the impurities serving as hole traps substitute for the impurities that are electrically neutral and interstitial in the crystalline lattice included in the upper layer and the lower layer of the n type InP second current blocking layer 16 in the fourth embodiment of the invention. A fabricating method according to the sixth embodiment of the invention is the same as in the fourth embodiment, except that InP is grown to include dopant impurities producing n type conductivity and impurities serving as hole traps, such as Co, during the epitaxial growth of the upper layer and the lower layer of the second current blocking layer. In this case, the p type InP first current blocking layer 12 has a higher charge carrier concentration than the n type InP second cladding layer 3, and the p type InP third current blocking layer 13 has a higher charge carrier concentration than the n type InP contact layer 8. Therefore, when the substrate is heated during the epitaxial growth to a suitable temperature, dopant impurities producing p type conductivity diffuse from the first and third current blocking layers 12 and 13 to the second cladding layer 3 and the contact layer 8, and the conductivity type of a thin portion of the second cladding layer 3 and the contact layer 8 comprising n type InP in contact with the current blocking layers is reversed to p type. In addition, this diffusion may be carried out by heat treatment after the epitaxial growth.

In the sixth embodiment of the invention, as shown in FIG. 10, due to the diffusion of the dopant impurities, a p-n junction between the third current blocking layer 13 and the contact layer 8, i.e., a p-n junction with the upper portion of the burying layer, is formed at a position 14a in the contact layer 8 removed from the interface 9a between the third current blocking layer 13 and the contact layer 8, i.e., the regrowth interface with the upper portion of the crystalline burying layer. Likewise, a p-n junction between the first current blocking layer 12 and the second cladding layer 3, i.e., a p-n junction with the side surface of the second cladding layer 3, is formed at a position 14b in the second cladding layer 3 removed from the interface 9b between the first current blocking layer 12 and the second cladding layer 3, i.e., the regrowth interface with the side surface of the second cladding layer 3. Therefore, as described above, in these p-n junctions, the forward voltage is not reduced under continuous operation, avoiding deterioration of laser characteristics.

Meanwhile, since the upper layer 16c and the lower layer 16b of the second current blocking layer in contact with the third and first current blocking layers 13 and 12 include the impurities serving as hole traps, the diffusion of holes from the p type InP first and third current blocking layers 12 and 13 to the n type InP second current blocking layer 16 is suppressed. Although the impurities serving as hole traps tend to obstruct the activation of the dopant impurities in the second current blocking layer 16, the intermediate layer 16a of the second current blocking layer includes the dopant impurities producing n type conductivity but it does not include the impurities serving as hole traps. Consequently, the charge carrier concentration is higher than when the impurities serving as hole traps are introduced into the entirety of the second current blocking layer 16, as in the fifth embodiment of the invention, whereby deterioration of the current blocking effect of the current blocking layers is further suppressed.

In the sixth embodiment of the invention, deterioration of the laser characteristics under continuous operation is prevented without reducing the current blocking effect of the current blocking layers.

In addition, although an InP semiconductor laser device is described, the same fabricating method and the same structure may be adopted in a semiconductor laser device comprising another material, such as GaAs. The number of current blocking layers need not be three.

What is claimed is:

1. A semiconductor laser device including:

a ridge waveguide having two side surfaces;

a burying crystalline layer disposed at both side surfaces of the ridge waveguide; and a contact layer disposed on the burying crystalline layer and the ridge waveguide, the burying crystalline layer comprising a first current blocking layer in contact with the side surfaces of the ridge waveguide and comprising a first conductivity type semiconductor, a second current blocking layer disposed on a portion of the first current blocking layer and separated from the ridge waveguide by a portion of the first current blocking layer proximate the ridge waveguide, and comprising a second conductivity type semiconductor, opposite the first conductivity type, a third current blocking layer disposed on the portion of the first current blocking layer proximate the ridge waveguide and on the second current blocking layer and comprising a first conductivity type semiconductor, and a final burying layer disposed on the third current blocking layer and comprising a second conductivity type semiconductor, the contact layer having the second conductivity type semiconductor.

2. A semiconductor laser device including:

a ridge waveguide having two side surfaces;

a burying crystalline layer disposed both side surfaces of the ridge waveguide; and a contact layer disposed on the burying crystalline layer and the ridge waveguide, the ridge waveguide comprising a first cladding layer comprising a first conductivity type semiconductor, an active layer disposed on the first cladding layer, and a second cladding layer disposed on the active layer, a main portion of the cladding layer comprising a semiconductor having a second conductivity type, opposite the first conductivity type, the burying crystalline layer comprising a first current blocking layer in contact with the side surfaces of the ridge waveguide and comprising a first conductivity type semiconductor, a second current blocking layer disposed on a portion of the first current blocking layer and separated from the ridge waveguide by a portion of the first current blocking layer proximate the ridge waveguide, and comprising a second conductivity type semiconductor, and a third current blocking layer disposed on the portion of the first current blocking layer proximate the ridge waveguide and on the second current blocking layer and comprising a first conductivity type semiconductor; wherein a main portion of the contact layer has the second conductivity type;

a portion of the first current blocking layer in contact with the ridge waveguide has a carrier concentration higher than that of the main portion of the second cladding layer, and a thin portion of the second cladding layer at an interface between the second cladding layer and the first current blocking layer has the first conductivity type;

a portion of the third current blocking layer in contact with the contact layer has a carrier concentration higher than that of a portion of the contact layer, and a thin portion of the contact layer at an interface between the contact layer and the third current blocking layer has the first conductivity type; and a portion of the third current blocking layer in contact with the second current blocking layer has a carrier concentration lower than that of a portion of the third current blocking layer in contact with the contact layer.

3. A semiconductor laser device including:

a ridge waveguide having two side surfaces;

a burying crystalline layer disposed at both side surfaces of the ridge waveguide; and a contact layer disposed on the burying crystalline layer and the ridge waveguide, the ridge waveguide comprising a first cladding layer comprising a first conductivity type semiconductor, an active layer disposed on the first cladding layer, and a second cladding layer disposed on the active layer, a main portion of the cladding layer comprising a semiconductor having a second conductivity type opposite the first conductivity type, the burying crystalline layer comprising a first current blocking layer in contact with the side surfaces of the ridge waveguide and comprising a first conductivity type semiconductor, a second current blocking layer disposed on a portion of the first current blocking layer and separated from the ridge waveguide by a portion of the first current blocking layer proximate the ridge waveguide, and comprising a second conductivity type semiconductor, and a third current blocking layer disposed on the portion of the first current blocking layer proximate the ridge waveguide and on the second current blocking layer and comprising a first conductivity type semiconductor; wherein a main portion of the contact layer comprises a second conductivity type semiconductor;

the first current blocking layer has a carrier concentration higher than that of a main portion of the second cladding layer, and a thin portion of the second cladding layer at an interface between the second cladding layer and the first current blocking layer has the first conductivity type;

the first conductivity type semiconductor of the third current blocking layer has a carrier concentration higher than that of the main portion of the contact layer, and a thin portion of the contact layer at an interface between the contact layer and the third current blocking layer has the first conductivity type; and the second current blocking layer includes impurities that are electrically neutral and interstitial.

4. The semiconductor laser device of claim 3 wherein the impurities that are electrically neutral are included only in thin layer portions of the second current blocking layer in contact with the first and third current blocking layers.

5. A semiconductor laser device including:

a ridge waveguide having two side surfaces;

a burying crystalline layer disposed both side surfaces of the ridge waveguide; and a contact layer disposed on the burying crystalline layer and the ridge waveguide, the ridge waveguide comprising a first cladding layer comprising a p type semiconductor, an active layer disposed on the first cladding layer, and a second cladding layer disposed on the active layer, a main portion of the second cladding layer comprising an n type semiconductor, the burying crystalline layer comprising a first current blocking layer in contact with the side surfaces of the ridge waveguide and comprising a p type semiconductor, a second current blocking layer disposed on a portion of the first current blocking layer, separated from the ridge waveguide by the portion of the first current blocking layer proximate the ridge waveguide, and comprising an n type semiconductor, and a third current blocking layer disposed on a portion of the first current blocking layer proximate the ridge waveguide on the second current blocking layer, and comprising a p type semiconductor; wherein a main portion of the contact layer is n type;

the p type semiconductor of the first current blocking layer has a carrier concentration higher than that of a main portion of the second cladding layer, and a thin portion of the second cladding layer at an interface between the second cladding layer and the first current blocking layer is p type;

the p type semiconductor of the third current blocking layer has a carrier concentration higher than that of the main portion of the contact layer, and a thin portion of the contact layer at an interface between the contact layer and the third current blocking layer is p type; and the second current blocking layer includes impurities serving as hole traps.

6. The semiconductor laser device of claim 5 wherein the impurities serving as the hole traps are included only in thin layer portions of the second current blocking layer in contact with the first and third current blocking layers.

* * * * *

UNITED STATES PATENT AND TRADEMARK OFFICE
CERTIFICATE OF CORRECTION

PATENT NO. : 5,596,592
DATED : January 21, 1997
INVENTOR(S) : Tanigami et al.

It is certified that error appears in the above-indentified patent and that said Letters Patent is hereby corrected as shown below:

```
Column 19, Line 66, insert "at" before --both--;

Column 21, Line 21, insert "at" before --both--.
```

Signed and Sealed this

Fifteenth Day of April, 1997

Attest:

BRUCE LEHMAN

*Attesting Officer*   *Commissioner of Patents and Trademarks*